(12) United States Patent
Hinz et al.

(10) Patent No.: US 8,250,436 B2
(45) Date of Patent: Aug. 21, 2012

(54) MEMORY-MODULE CONTROLLER, MEMORY CONTROLLER AND CORRESPONDING MEMORY ARRANGEMENT AND ALSO METHOD FOR ERROR CORRECTION

(75) Inventors: Torsten Hinz, Munich (DE); Gerhard Risse, Munich (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 13/287,488

(22) Filed: Nov. 2, 2011

(65) Prior Publication Data
US 2012/0110414 A1 May 3, 2012

Related U.S. Application Data

(62) Division of application No. 11/740,762, filed on Apr. 26, 2007, now Pat. No. 8,078,937.

(30) Foreign Application Priority Data

Apr. 26, 2006 (DE) .......................... 10 2006 019 426

(51) Int. Cl.
*G11C 29/00* (2006.01)
*G06F 13/00* (2006.01)

(52) U.S. Cl. ........................................ 714/763; 711/167
(58) Field of Classification Search .................. 714/746, 714/763; 711/5, 117, 149, 167, 209, 220
See application file for complete search history.

(56) References Cited

U.S. PATENT DOCUMENTS

| | | | |
|---|---|---|---|
| 6,425,063 B1 * | 7/2002 | Mattson et al. | 711/167 |
| 6,941,505 B2 * | 9/2005 | Yada et al. | 714/763 |
| 7,114,117 B2 * | 9/2006 | Tamura et al. | 714/763 |

* cited by examiner

*Primary Examiner* — Shelly A Chase
(74) *Attorney, Agent, or Firm* — Murphy, Bilak & Homiller, PLLC

(57) ABSTRACT

A memory arrangement comprises a first memory module and a second memory module. An item of information to be written to the memory arrangement is written with a first address both to the first memory module and to the second memory module. When reading, the item of information is read either from the first memory module by means of the first address or from the second memory module by means of a second address differing from the first address. Subsequently a check is made as to whether the item of information is defective. If this is the case, the item of information is read from the respective other memory module.

9 Claims, 1 Drawing Sheet

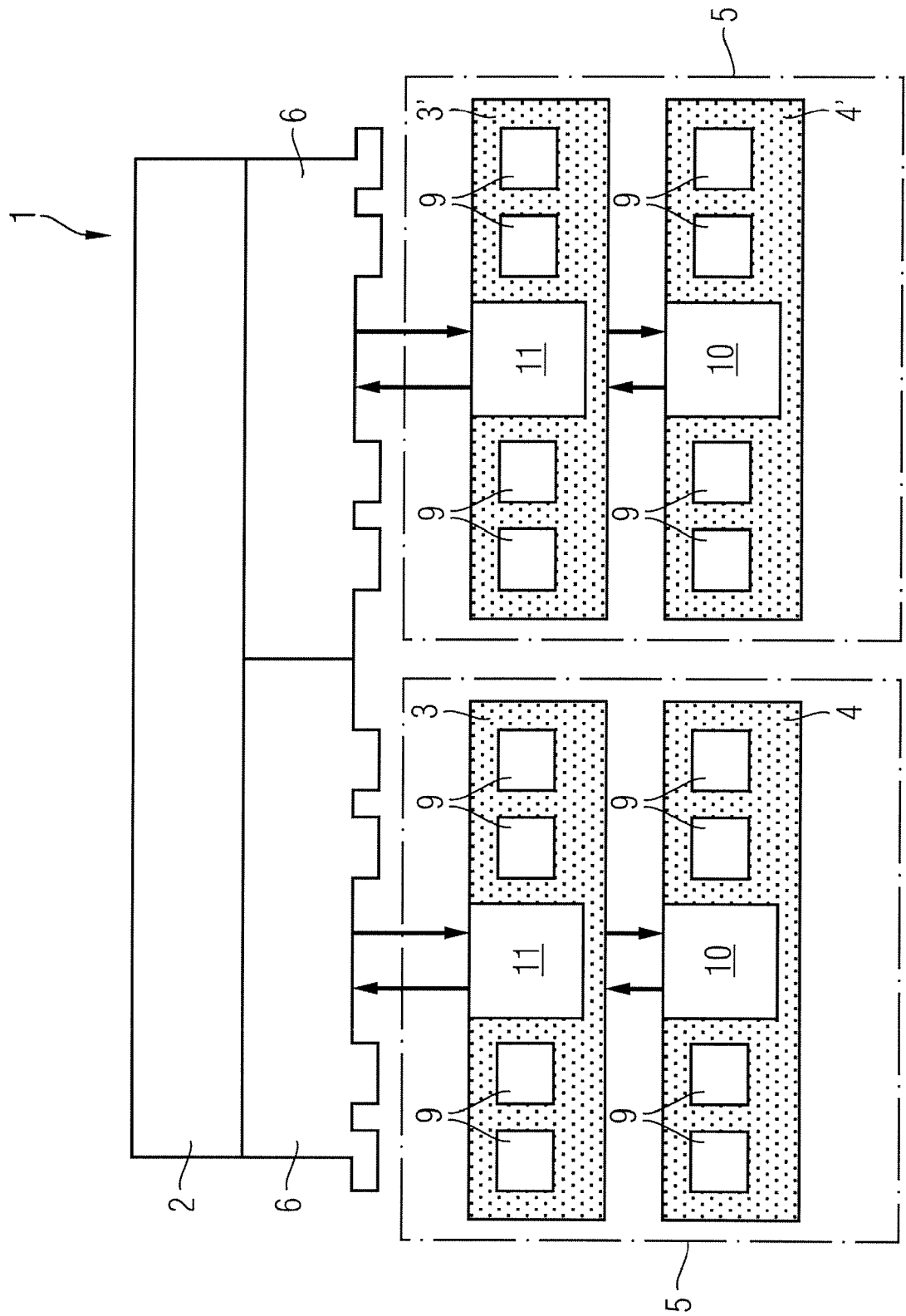

MEMORY-MODULE CONTROLLER, MEMORY CONTROLLER AND CORRESPONDING MEMORY ARRANGEMENT AND ALSO METHOD FOR ERROR CORRECTION

RELATED APPLICATION—CLAIM OF PRIORITY

The present application claims the priority of German Patent Application DE 10 2006 019 426.8 filed Apr. 26, 2006. This application claims the benefit of the filing date of the referenced German Patent Application under 35 U.S.C. §119. The present application is also a divisional of U.S. application Ser. No. 11/740,762 filed Apr. 26, 2007. The content of each priority applications is incorporated herein by reference in its entirety.

FIELD OF THE INVENTION

The present invention relates to a method for error correction for a memory arrangement and also to an appropriately configured memory-module controller, to a memory controller and to a memory arrangement.

The present invention will be described in more detail in the following with reference to the single FIGURE on the basis of preferred embodiments.

BRIEF DESCRIPTION OF THE DRAWING

The single FIGURE represents a memory arrangement according to the invention with four memory modules and with a memory controller for controlling the memory modules.

DESCRIPTION OF THE INVENTION

Memory modules—such as, for example, fully buffered DIMMs (Dual Inline Memory Modules)—do not have any built-in redundancy in order to correct errors arising in their memory chips that exceed the error-correcting possibilities of an ECC code (Error Checking and Correction code). In the course of the error correction by means of the ECC code, redundant bits are generated, starting from the bits to be stored pertaining to a predetermined item of information, which are stored together with the predetermined bits. When reading, a check is now made by means of the ECC code as to whether errors have occurred, whereby, depending on the severity of the error and on the proportion of redundant bits with respect to the bits stored overall, the error is either corrected or merely recognized as such.

Although memory controllers are known that, with a view to avoiding errors, mirror each bit to be stored or, to be more exact, store said bit twice, such a method can be disadvantageous because the requisite bandwidth rises by 100%, because each bit is written twice by the memory controller.

According to an embodiment of the present invention, a method is made available for error correction for a memory arrangement. In this implementation, the memory arrangement comprises a first and a second memory module which are both preferentially fully buffered dual in-line memory modules (DIMMs). An item of information to be stored in the memory arrangement is written to the first memory module under a first address which is assigned to the first memory module. In the course of writing the item of information to the first memory module, the item of information is simultaneously also written to the second memory module with the first address—i.e., the first address is both utilized in order to write the item of information to the first memory module and utilized in order to write the item of information to the second memory module. The item of information is accordingly stored simultaneously in the first and second memory modules by means of a write-instruction, and in such an implementation, the second memory module may be regarded as a redundant memory module. For the purpose of reading the item of information, the latter is read either from the first memory module by means of the first address, or from the second memory module by means of a second address, differing from the first address, which can be derived from the first address. Subsequently a check is made, for example by means of an ECC code, as to whether the item of information is defective. If the item of information is defective—i.e., the item of information also cannot be corrected by means of the ECC code—the item of information is read from the respective other memory module, use being made of the first address when reading from the first memory module, and use being made of the second address when reading from the second memory module.

When writing data, because the item of information is written simultaneously—i.e., with the same write-instruction—both to the first and to the second memory module, writing in this manner is advantageous because the bandwidth required for writing is not increased in comparison with a method that writes the item of information to one memory module only. When reading, because the item of information is only read from both the first and the second memory modules when the item of information is recognized as being defective upon first reading, the bandwidth required for reading is increased only in comparison with a method that reads the item of information from a memory module once when the item of information is defective upon first reading, i.e., when the method that reads the item of information from a memory module once only has no possibility of reading or outputting the item of information correctly. In other words, when reading the item of information in the successful case—i.e., the item of information is not defective or can be corrected, for example by means of the ECC code—the bandwidth of the method according to the invention is equal to the bandwidth of the conventional method which reads the item of information from a memory module once only.

According to another embodiment, the second memory module corresponds to the first memory module with regard to its speed (clock frequency), memory capacity and memory organization (arrangement of ranks, addressing schema).

Generally, although the method according to the invention may also operate with a second memory module that does not correspond to the first memory module with regard to speed, memory capacity and memory organization, the method according to the invention becomes substantially simpler if the first and second memory modules correspond with regard to speed, memory capacity and memory organization or if the second memory module has a higher speed and a greater memory capacity than the first memory module.

If the speed of the second memory module is lower than that of the first memory module, the method according to the invention would have to take this lower speed of the second memory module into account when writing the item of information. If the memory capacity of the second memory module lies below the memory capacity of the first memory module, the method according to the invention would have to take this into account, to the effect that certain items of information are not written to the second memory module simultaneously, so that in the event of an error these items of information could not then be read from the second memory module.

In a preferred embodiment, in the course of reading the item of information the item of information is read periodically from the first and second memory modules alternately. In other words, when reading, before the corresponding item of information is checked for errors, a first item of information is read from, for example, the first memory module, a second item of information is read from the second memory module, a third item of information is read from the first memory module, etc.

Because the item of information is checked for errors after being read, both with respect to the first memory module and with respect to the second memory module, whether an error is present is detected when reading the item of information alternately from the first memory module and from the second memory module. If an error is present when the item of information is read, this usually indicates that certain memory cells of the memory module from which the item of information has been read are defective. Even if such an error can be corrected with the ECC code, it is an indication of the quality of the memory module, which can be used, for example, in order to inform an administrator about the declining quality of the corresponding memory module. If the item of information is read from the first memory module only, and a read operation from the second memory module is performed only if an error is detected in the course of checking the item of information, the quality of the second memory module would be unknown, which, in a worst case, could have the result that the second memory module has already failed as a result of being defective if a read operation is performed therefrom because a defective item of information read from the first memory module.

Let it be pointed out that the method according to the invention is also applicable to a memory arrangement that comprises several first and, correspondingly, several second memory modules. In this implementation, an item of information that is written to a particular first memory module is simultaneously also written to a particular second memory module assigned to the first memory module, so that, in accordance with the invention, the item of information can be read either from the particular first or from the particular second memory module, and in the event of an error—i.e., if the item of information that has been read is uncorrectable—reading is effected from the respective other memory module.

Furthermore, in accordance with the invention it is possible that several second memory modules have been assigned to one first memory module, so that an item of information that is written to the first memory module is written simultaneously to these several second memory modules. In the course of reading the item of information, the latter is then read from a memory module pertaining to a set that consists of the first memory module and the several second memory modules. Should it be detected in the course of checking the item of information that this item of information is uncorrectable, the item of information is read from other memory modules pertaining to the set until the item of information is present without errors. Hence, in accordance with the invention, it is possible to reduce almost entirely the probability that the item of information will be misread in an uncorrectable manner by reason of memory errors.

Within the scope of the present invention a memory-module controller for a memory module, in particular for a fully buffered DIMM, is also disclosed. Upon receiving a write-instruction, the memory-module controller according to the invention writes an item of information assigned to the write-instruction to at least one memory chip of the memory module if a write-instruction address, which is an address used for write-instructions, has been assigned to the memory module. Upon receiving a read-instruction, the memory-module controller reads the item of information if a read-instruction address, which is an address used for read-instructions, has been assigned to the memory module. In this implementation, the write-instruction address is not identical to the read-instruction address, though it is known which write-instruction address corresponds with which read-instruction address.

By the write-instruction address not being identical to the read-instruction address, the memory-module controller can be configured in such a manner that the memory-module controller stores each item of information in the second memory module that is also stored by a first memory module. In this implementation, in the case of the first memory module the item of information is stored under the same address - more precisely the write-instruction address—under which address—more precisely the read-instruction address—the item of information is then also read. By the read-instruction addresses that have been assigned to the second memory module being chosen in such a manner that they are not the same as the read-instruction addresses that have been assigned to the first memory module, an item of information can be read selectively either from the first memory module or, by means of the memory-module controller according to an implementation of the invention, from the second memory module.

According to an embodiment of the invention, the memory-module controller is configured in such a manner that it, on one hand, passes on incoming data arriving at it—for example, read-instructions, write-instructions—to other memory modules, for example, and, on the other hand, temporarily stores said data in a buffer. Subsequently the memory-module controller evaluates the data in this buffer.

By the data being passed on immediately, it is ensured that the data can be passed from one memory module to the next memory module almost without delay.

According to another embodiment of the invention, the memory-module controller can also be configured in such a manner that the memory-module controller operates like a conventional commercial memory-module controller. This means that the memory-module controller according to the invention can be configured in such a manner that the item of information is written to the memory module using the same address—more precisely, the write-instruction address—under which address—more precisely, the read-instruction address—the item of information is then read from the memory module by means of the memory-module controller.

As a result, the memory-module controller according to implementations of the invention, or a memory module that exhibits the memory-module controller according to the invention, advantageously can be either employed like a conventional commercial memory-module controller, respectively like a conventional commercial memory module, or, if the memory-module controller has been configured appropriately, employed in such a manner that the memory-module controller according to the invention, or the memory module, is employed for the purpose of generating a type of security copy of the memory contents of an assigned memory module.

Within the scope of the present invention a memory controller is also made available for a memory arrangement comprising several memory modules. In this implementation, the memory controller writes an item of information to be written to the memory arrangement under a first address, which has been assigned to a first memory module, to this first memory module. In this implementation, the memory controller assumes that the item of information is written simultaneously to a second memory module which has been assigned to the first memory module. When reading the item of information, the memory controller reads the item of information either from the first memory module by means of the first address or from the second memory module by means of a second address, which differs from the first address but which can be derived from the first address by the memory controller. Subsequently the memory controller checks whether the item of information that has been read is defective or uncorrectable. If this is the case, the memory controller reads the item of information from the respective other memory module, and in this implementation it uses the first address when reading from the first memory module, and uses the second address when reading from the second memory module.

Advantageously, when writing the item of information, the memory controller according to an implementation of the invention operates in a manner as a conventional commercial memory controller would operate, in which case of the item of information is written to one memory module only. In other words, in comparison with conventional commercial memory controllers, the memory controller according to the invention exhibits no disadvantage, for example, with respect to the band-width or processing-time required when writing the item of information, even though the item of information is written not just to one memory module but to two memory modules. Only when reading the item of information does the memory controller according to the invention utilize implicit knowledge of the fact that the item of information has been written to two memory modules, such that the memory controller reads the item of information either from the first or from the second memory module.

Let it be pointed out that the memory controller according to the invention could also be configured in such a manner that, prior to the check as to whether the item of information is defective, it always reads the item of information from the first memory module, so that the behavior of the memory controller according to the invention would differ from the behavior of a conventional commercial memory controller only when the item of information that has been read is detected to be defective. In this case, the memory controller according to the invention would read the item of information from the second memory module, whereas a conventional commercial memory controller could only report a read-error.

In another embodiment of the invention, the memory controller is capable of being configured via its basic input-output system (BIOS) in such a manner that it operates either as a conventional commercial memory controller or as previously described. If the memory controller according to the invention has been configured via its BIOS in such a manner that it operates as a conventional commercial memory controller, prior to the error checking, it reads the item of information from the first memory module only and does not read the item of information from the second memory module, even when an error that is not correctable has been detected upon reading the item of information from the first memory module.

Finally, within the scope of the present invention a memory arrangement is made available that comprises a first memory module and a second memory module, and also a memory controller for controlling the memory modules. In this implementation, the memory arrangement passes an item of information to be written to the first memory module and also to the second memory module in which the item of information is also stored. When reading the item of information, the memory arrangement reads the item of information either from the first memory module by means of a first address, with which the item of information has also been written to the first memory module, or from the second memory module using a second address which differs from the first address but which can be derived from the first address. If, in the course of a subsequent check of the item of information which is carried out by the memory arrangement, it turns out that the item of information exhibits an error that is not correctable, the memory arrangement reads the item of information from the respective other memory module. In this implementation, when reading from the first memory module it uses the first address, and when reading from the second memory module it uses the second address. Finally, the memory arrangement outputs the item of information.

The advantages of the memory arrangement according to embodiments of the invention correspond substantially with the advantages that previously were described in the discussion of the method according to the invention, of the memory-module controller according to the invention, or of the memory controller according to the invention. Because these advantages were previously described, they will not be repeated here.

The present invention is preferable for use in memory arrangements that employ fully buffered DIMMs. However, the invention is, of course, not restricted to this preferred field of application but may, for example, also be employed in memory arrangements in which a write-instruction directed to a particular memory module reaches another memory module.

In the following description, exemplary embodiments of the present invention will be described in detail. It is to be understood that the following description is given only for the purpose of illustrating the principles of the invention and is not to be taken in a limiting sense. Rather, the scope of the invention is defined only by the appended claims and is not intended to be limited by the exemplary embodiments described hereinafter.

The single FIGURE shows a memory arrangement 1 according to the invention which comprises two first memory modules 3, 3', two second memory modules 4, 4' according to the invention and a memory controller 2 according to the invention for controlling the four memory modules 3, 3', 4, 4'. In this implementation, the memory arrangement 1 exhibits two channels 6, the first memory module 3 and the second memory module 4 being assigned to the one channel, and the first memory module 3' and the second memory module 4' being assigned to the other channel. The two channels may be written to or read from simultaneously by the memory controller 2.

The memory controller 2 knows that the memory modules 3, 4, 3', 4' are arranged in groups 5, with the memory modules 3, 4 and the memory modules 3', 4' each forming a group. In this implementation, both the first memory module 3, 3' and the second memory module 4, 4' of a group stores the same item of information. In other words, the memory contents of the two memory modules 3, 4, 3', 4' of a group 5 are identical.

Each memory module 3, 3', 4, 4' possesses memory chips 9 and an AMB (Advanced Memory Buffer) or, to be more exact, a memory-module controller 10, 11. In this implementation, the memory-module controllers 11 of the first memory modules 3, 3' are each configured in such a manner that they operate like conventional commercial memory-module controllers. Consequently the two first memory modules 3, 3' operate like conventional commercial memory modules— i.e., the memory controller 2 reads an item of information from the first memory module 3, 3' using the same address with which it has also written this item of information to the corresponding first memory module 3, 3'. On the other hand, each of the memory-module controllers 10 of the second memory modules 4, 4' is configured in such a manner that the second memory modules 4, 4' likewise store an item of information that is written by the memory controller 2 to the first memory module 3, 3' assigned to the respective second memory module 4, 4'.

The operation of an embodiment of the invention will be presented in detail in the following. Each memory module 3, 3', 4, 4' possesses a memory-module address, so that in a channel 6 the memory controller 2 is able to address either the first memory module 3, 3' or the second memory module 4, 4'. This memory-module address is both an integral part of an address of a write-instruction and an integral part of an address of a read-instruction. The memory-module controller 10 of the second memory module 4, 4' is set up in such a manner that it interprets a write-instruction which has actually been addressed with its memory-module address to the first memory module 3, 3' as a storage instruction addressed to its memory module 4, 4' and stores the item of information assigned to the write-instruction under the same address (i.e., the portion of the address of the write-instruction other than the portion identifying the memory-module address) in the second memory module 4, 4' under which this item of information is also stored in the first memory module 3, 3'. The memory controller 2 is configured via its BIOS in such a manner that it never uses the memory-module address of the second memory modules 4, 4' in a write instruction.

The set-up of the memory-module controller 10 of the second memory modules 4, 4' in this implementation concerns only a central control block of the memory-module controller 10, with the set-up being effected with special bytes. Using these special bytes the memory-module controller 10 is able to derive the memory-module address at which it stores the item of information if this memory-module address is contained in the address of a write-instruction.

Since the two memory modules 3, 4, 3', 4' of a group 5 are connected to the memory controller 2 using the daisy-chain principle, when a write-instruction is received, the item of information is written simultaneously both to the first memory module 3, 3' and to the second memory module 4, 4'. Because the item of information is written simultaneously both to the first memory module 3, 3' and to the second memory module 4, 4' with the same write-instruction, on the one hand the memory controller 2 is not further burdened by the additional storing of the item of information in the second memory module 4, 4', and on the other hand the bandwidth required for writing the items of information to the two memory modules 3, 4, 3', 4' is equal to a bandwidth with which the item of information is conventionally written to one memory module only.

In the course of a read-operation, the memory controller 2 is configured via its BIOS in such a manner that it reads an item of information to be read from the first memory module 3, 3' and from the second memory module 4, 4' alternately. In other words, the memory controller 2 knows implicitly that the item of information has been stored in the two mutually assigned memory modules 3, 4, 3', 4'. Subsequently the memory controller 2 checks the item of information with the aid of the ECC code. If in this implementation the memory controller 2 detects an error that is not correctable, the memory controller 2 reads the item of information from the respective other memory module 4, 3, 4', 3'.

If a temporal response of the memory arrangement 1 according to the invention is compared with a temporal response of a conventional memory arrangement, it is found that the temporal response when writing an item of information is identical. This means that the memory arrangement 1 according to the invention requires no additional time in comparison with a conventional memory arrangement in order to store the item of information both in the first memory module 3, 3' and in the second memory module 4, 4'. Also in the case of a successful first reading of the item of information—i.e., the item of information is error-free or can be corrected by the ECC code—the temporal response of the memory arrangement 1 according to the invention does not differ from the temporal response of a conventional memory arrangement. Only if the memory controller 2 according to the invention detects, upon first reading of the item of information, an error that is not correctable by the ECC code does the temporal response of the memory arrangement 1 according to the invention differ from the temporal response of the conventional memory arrangement, because the memory arrangement 1 according to the invention reads the item of information a second time from the respective other memory module 4, 4', 3, 3'. In this implementation, it is to be noted that in this case the conventional memory arrangement has no possibility of reading out the item of information correctly. In other words, the memory arrangement 1 according to the invention only requires more time than the conventional memory arrangement when it thereby also provides a genuine added value in comparison with the conventional memory arrangement.

The memory arrangement 1 represented in the FIGURE could also be set up in such a manner that the second memory modules 4, 4' behave like conventional commercial memory modules. In this case the memory controller 2 is likewise configured like a conventional commercial memory controller, so that an item of information to be stored is also written explicitly to the second memory modules 4, 4' by the memory controller 2, by the corresponding second memory module 4, 4' being addressed by its memory-module address when a write-instruction is received.

In an embodiment of the invention which is not represented in the FIGURE, in each instance of each channel 6 of the memory arrangement 1 additional groups of a first memory module and a second memory module assigned to this first memory module could be present. In this implementation, each first memory module of the further groups behaves in principle like standard commercial memory modules—i.e., the item of information is written in the same memory-module address from it is also read, and each second memory module of the further groups behaves like the initially described second memory modules 4, 4'—i.e., the item of information is written with the memory-module address of the first memory module assigned to the respective second memory module and is read with the memory-module address of the respective second memory module.

Finally, instead of a single second memory module 4, 4' several second memory modules could have been assigned to the first memory module 3, 3'. In this case, a write-instruction of the memory controller 2, which contains as a memory-module address the memory-module address of the first memory module 3, 3', would write the item of information both to the first memory module 3, 3' and to the second memory modules assigned to the first memory module 3, 3'. When reading the item of information, the memory controller 2 would read the item of information periodically from a memory module of a set that is composed of the first memory module and the second memory modules assigned to this first memory module. If the item of information that has been read is not correctable by the ECC code, the memory controller would read the item of information from the other memory module pertaining to this set. If the item of information is not correctable by means of the ECC code after this second reading, the memory controller would read the item of information from yet another memory module pertaining to the set, this being repeated until either an item of information that is correctable by the ECC code is present or until the memory controller has read the item of information from all the memory modules pertaining to this set.

The invention claimed is:

1. A memory-module controller for a memory module, wherein:
   the memory-module controller is configured, upon receiving a write-instruction, to write an item of information corresponding to a write-instruction to at least one memory chip of the memory module if an address corresponding to the write-instruction has been assigned to the memory module;
   the memory-module controller is configured, upon receiving a read-instruction, to read out the item of information that has been assigned to an address corresponding to the read-instruction from the at least one memory chip and outputs it via at least one output terminal of the memory module if the address corresponding to the read-instruction has been assigned to the memory module; and
   the address corresponding to the write-instruction for the purpose of writing the item of information is not identical to the address corresponding to the read-instruction for the purpose of reading the same item of information.

2. The memory-module controller according to claim 1, wherein the memory-module controller includes a memory-module controller for a fully buffered DIMM.

3. The memory-module controller according to claim 1, wherein the memory-module controller includes input terminals corresponding to output terminals of the memory-module controller, and the memory-module controller is configured such that one of:
   passes each received instruction including one of the write-instruction or read-instruction applied to the input terminals of the memory-module controller to the corresponding output terminals of the memory-module controller; and
   temporarily stores in a buffer of the memory-module controller, and wherein the memory-module controller subsequently evaluates the instruction stored in the buffer.

4. The memory-module controller according to claim 1, wherein the memory-module controller is configured to read the item of information with an address corresponding to the read-instruction, wherein the address corresponding to the read-instruction identical to the address corresponding with the write-instruction with which the item of information was written to the memory module by the memory-module controller.

5. A memory arrangement, comprising:
   a first memory module;
   a second memory module; and
   a memory controller in communication with the first memory module and the second memory module and configured for controlling the first memory module and the second memory module and for writing information to the first memory module and the second memory module, wherein the memory controller is further configured to:
     pass the item of information to be written to the first memory module to the second memory module; and
     write to the first memory module the item of information under a first address assigned to the first memory module; and
   wherein the memory arrangement is further configured to: read the item of information from one of the first memory module and from the second memory module and check the item of information for errors;
   when an error is detected, the memory arrangement reads the item of information from a respective other memory module, wherein the second memory module is the respective other memory module of the first memory module and the respective other memory module of the first memory module is the second memory module;
   when reading from the first memory module, the memory arrangement uses the first address and when reading from the second memory module, the memory arrangement uses a second address differing from the first address; and
   output the item of information.

6. The memory arrangement according to claim 5, wherein:
   the first memory module and the second memory module are connected to the memory controller in the form of a chain using the daisy-chain principle; and
   wherein the first memory module is the first memory module of this chain.

7. The memory arrangement according to claim 5, wherein the second memory module includes a memory-module controller, wherein:
   the memory-module controller is configured, upon receiving a write-instruction, to write an item of information corresponding to a write-instruction to at least one memory chip of the memory module if an address corresponding to the write-instruction has been assigned to the memory module;
   the memory-module controller is configured, upon receiving a read-instruction, to read out the item of information that has been assigned to an address corresponding to the read-instruction from the at least one memory chip and outputs it via at least one output terminal of the memory module if the address corresponding to the read-instruction has been assigned to the memory module; and
   the address corresponding to the write-instruction for the purpose of writing the item of information is not identical to the address corresponding to the read-instruction for the purpose of reading the same item of information.

8. The memory arrangement according to claim 5, wherein the memory controller for the memory arrangement is a memory controller wherein:
   the memory controller is configured to write to a first memory module an item of information to be written to the memory arrangement under a first address assigned to a first memory module of the several memory modules;
   the memory controller is configured to read the item of information either from the first memory module by means of the first address or from a second memory module pertaining to the several memory modules by means of a second address differing from the first address;
   the memory controller checks whether the item of information is defective; and
   when the memory controller detects that the item of information is defective, the memory controller reads the item of information from a respective other memory module, wherein the second memory module is the respective other memory module of the first memory module and the respective other memory module of the first memory module is the second memory module and the memory controller using the first address in the case of reading from the first memory module and using the second address in the case of reading from the second memory module.

9. The memory arrangement according to claim 5, wherein the memory arrangement is configured for writing an item of information to the memory arrangement to the first memory module under a first address assigned to the first memory module;

writing the item of information to the second memory module using the first address;

reading the item of information from one of the first memory module by means of the first address and from the second memory module by means of a second address differing from the first address; and checking whether the item of information is defective; and when the item of information is defective, the item of information is read from a respective other memory module such that the second memory module is the respective other memory module of the first memory module and the respective other memory module of the first memory module is the second memory module, the first address being used in the case of reading from the first memory module, and the second address being used in the case of reading from the second memory module.

* * * * *